US012379421B2

United States Patent
Lyu et al.

(10) Patent No.: US 12,379,421 B2
(45) Date of Patent: Aug. 5, 2025

(54) IN-SITU ULTRASONIC METHOD FOR DETECTING THE STATE OF CHARGE IN SOFT-PACKAGED LITHIUM-ION BATTERIES

(71) Applicant: BEIJING UNIVERSITY OF TECHNOLOGY, Beijing (CN)

(72) Inventors: Yan Lyu, Beijing (CN); Jie Gao, Beijing (CN); Xuan Liu, Beijing (CN); Bin Wu, Beijing (CN); Cunfu He, Beijing (CN)

(73) Assignee: BEIJING UNIVERSITY OF TECHNOLOGY, Beijing (CN)

( * ) Notice: Subject to any disclaimer, the term of this patent is extended or adjusted under 35 U.S.C. 154(b) by 0 days.

(21) Appl. No.: 18/650,083

(22) Filed: Apr. 30, 2024

(65) Prior Publication Data

US 2024/0361394 A1    Oct. 31, 2024

Related U.S. Application Data

(63) Continuation of application No. PCT/CN2022/128499, filed on Oct. 31, 2022.

(30) Foreign Application Priority Data

Nov. 8, 2021   (CN) .......................... 202111315012.X

(51) Int. Cl.
  *G01R 31/387*  (2019.01)
  *G01N 29/07*   (2006.01)
  *G01N 29/24*   (2006.01)
  *G01R 31/367*  (2019.01)

(52) U.S. Cl.
  CPC ........... *G01R 31/387* (2019.01); *G01N 29/07* (2013.01); *G01N 29/2437* (2013.01); *G01R 31/367* (2019.01); *G01N 2291/023* (2013.01)

(58) Field of Classification Search
  CPC .... G01R 31/387; G01R 31/367; G01N 29/07; G01N 29/2437
  See application file for complete search history.

(56) References Cited

U.S. PATENT DOCUMENTS

| 2012/0304771 A1 | 12/2012 | Yamamoto |
| 2016/0223498 A1 | 8/2016 | Steingart |

(Continued)

FOREIGN PATENT DOCUMENTS

| CN | 103411567 A | 11/2013 |
| CN | 106680730 A | 5/2017 |

(Continued)

OTHER PUBLICATIONS

Zhang Chuang; Sun Bo; Dou Haiming; Liu Suzhen; Li Xingchen., Lithium ion battery charge state characterization method based on sound wave time domain characteristics. CN 113189506 Machine Translation, Jul. 30, 2021 (Year: 2021).*

(Continued)

*Primary Examiner* — Yoshihisa Ishizuka
(74) *Attorney, Agent, or Firm* — J.C. PATENTS

(57) ABSTRACT

The present invention discloses a method for in-situ detection of the state of charge (SOC) of pouch-type lithium-ion batteries using ultrasonic guided waves. The invention involves attaching two circular piezoelectric patches symmetrically at a fixed distance from each other on the surface of the lithium-ion battery using a coupling agent. A function generator is controlled to produce a Hanning-window-modulated five-cycle sine signal to excite the circular piezoelectric patch located on the left side of the battery, generating ultrasonic guided waves within the battery. These waves are then received by the circular piezoelectric patch located on the right side of the battery. The received guided wave signal is processed to extract the time-domain characteristic parameters of the wave (transit time). Based on the (Continued)

correspondence between the guided wave characteristic parameters (transit time) and the state of charge, the method enables the detection of the SOC of the pouch-type lithium-ion battery. The invention employs a pair of circular piezoelectric patches in a one-actuation, one-reception manner for the detection of lithium-ion batteries, achieving in-situ detection of the SOC of pouch-type lithium-ion batteries without the need to record external parameters such as current and voltage.

1 Claim, 5 Drawing Sheets

(56) References Cited

U.S. PATENT DOCUMENTS

| | | | |
|---|---|---|---|
| 2018/0164383 A1* | 6/2018 | Hsieh | H01M 10/486 |
| 2019/0072614 A1* | 3/2019 | Steingart | G01N 29/4481 |
| 2019/0207274 A1* | 7/2019 | Ladpli | G01N 29/07 |

FOREIGN PATENT DOCUMENTS

| | | | |
|---|---|---|---|
| CN | 106772063 A | | 5/2017 |
| CN | 108872868 A | | 11/2018 |
| CN | 109565089 A | | 4/2019 |
| CN | 111048852 A | * | 4/2020 |
| CN | 111880107 A | | 11/2020 |
| CN | 113189506 A | | 7/2021 |
| CN | 114200326 A | | 3/2022 |

OTHER PUBLICATIONS

International Search Report for PCT/CN2022/128499.
First Search Report of the priority application CN202111315012.X.
Supplemental Search Report of the priority application CN202111315012.X.
First Office Action of the priority application CN202111315012.X.

* cited by examiner

IN-SITU ULTRASONIC METHOD FOR DETECTING THE STATE OF CHARGE IN SOFT-PACKAGED LITHIUM-ION BATTERIES

CROSS-REFERENCE TO RELATED APPLICATIONS

The present application is a continuation of the international application PCT/CN2022/128499 filed on Oct. 31, 2022, which claims the priority to the Chinese Patent Application No. 202111315012.X filed on Nov. 8, 2021. The entire contents of the above identified applications are incorporated herein by reference.

BACKGROUND OF THE INVENTION

1. Technical Field

The present invention pertains to the field of lithium-ion battery detection and relates to a method for in-situ detection of the state of charge (SOC) of pouch lithium-ion batteries using ultrasonic guided waves.

2. Background

With the rapid development of China's economy, the issue of resource scarcity is becoming increasingly severe, necessitating the development of various new types of energy sources, power batteries, and energy storage systems. Lithium-ion batteries, with their advantages of high energy density, good cycling performance, and low self-discharge rates, are very promising secondary batteries and chemical energy storage sources, widely used in fields such as new energy vehicles, consumer electronics, and aerospace. However, lithium-ion batteries are a complex material system, and improper monitoring and control of their state of charge (SOC) during use can lead to a decline in battery performance and even cause safety accidents such as fires or explosions, resulting in serious economic losses. Therefore, it is necessary to conveniently, quickly, and accurately obtain the internal state of charge (SOC) of lithium-ion batteries during their service life, and to control their charging and discharging, thermal management, etc., according to the SOC to ensure the safe operation of the batteries. At present, the state of charge (SOC) of pouch lithium-ion batteries cannot be directly measured and can only be estimated based on external parameters such as voltage and current. Common methods include coulomb counting, open-circuit voltage method, Kalman filtering, and neural network methods. However, these methods have issues such as inaccurate parameter measurement, excessive computational load, and unstable computational results, making it difficult to quickly and accurately obtain the battery's SOC. Therefore, there is a need to propose a method for quickly and accurately detecting the SOC of pouch lithium-ion batteries. Pouch lithium-ion batteries are essentially a multi-layered material structure composed of parts such as the anode, cathode, and separator. During the charging and discharging process of the battery, the intercalation and deintercalation of lithium ions between the anode and cathode cause significant changes in the density and modulus of the electrodes. Therefore, the mechanical-electrochemical coupling characteristics of the battery can be utilized to characterize its SOC by measuring the mechanical performance parameters of the battery. Ultrasonic guided wave non-destructive testing technology has the advantages of being fast, having low attenuation, and high accuracy, and is very sensitive to changes in the internal material properties of the structure. The changes in the mechanical properties (density and modulus) of the electrodes during the charging and discharging process of the battery will affect the propagation characteristics of ultrasonic guided waves within the battery. By observing the changes in the time-domain signals of the guided waves and establishing a connection between the guided wave characteristic parameters and the SOC, the detection of the battery's SOC can be realized. There is relatively more research on the detection of the SOC of pouch lithium-ion batteries at home and abroad, among which the coulomb counting method is widely used. This method calculates the amount of electricity flowing into and out of the battery by integrating the current and time, thereby estimating the SOC of the battery. Although the above method is relatively simple and fast and can detect the SOC of the battery, it still has the disadvantage of inaccurate estimation results. The main reason is that the coulomb counting method is an open-loop detection method. If the accuracy of current collection is not high or there is an error in the initial SOC, the errors generated will gradually accumulate with the increase of the battery's operating time, thereby affecting the estimation results of the battery's SOC. Moreover, since the coulomb counting method only uses the external characteristics of the battery to analyze the SOC, there are certain errors in multiple links, so it is also necessary to combine other methods to detect the SOC of the battery.

Inventive Content

The present invention provides a method for detecting the state of charge (SOC) of pouch lithium-ion batteries based on ultrasonic guided wave detection, which uses a set of piezoelectric patches located on the surface of the battery for the excitation and reception of guided wave signals, and realizes the detection of the battery's state of charge (SOC) based on the correspondence between the guided wave characteristic parameters (transit time) and the SOC. Compared with other methods, the invention is more conducive to achieving rapid, accurate, and real-time detection of the SOC of pouch lithium-ion batteries. To achieve the above purpose, the technical solution adopted by the present invention is a method for in-situ detection of the state of charge (SOC) of pouch lithium-ion batteries using ultrasonic guided waves. The detection device for implementing the detection method includes a computer 1, a set of circular piezoelectric patches 2, a pouch lithium-ion battery 3, charging and discharging equipment 4, a function generator 5, and a digital oscilloscope 6. In this setup, the computer 1 is connected to the charging and discharging equipment 4 and the digital oscilloscope 6, the circular piezoelectric patches 2 are connected to the arbitrary waveform generator 5 and the digital oscilloscope 6, and the pouch lithium-ion battery 3 is connected to the charging and discharging equipment 4. The specific implementation steps of the method include:

Step 1: Determine the length (L), thickness (T), and width (W) of the pouch lithium-ion battery to be tested. Based on the dimensions and material parameters of each component of the battery, establish a theoretical calculation model for the ultrasonic guided wave propagation within the lithium-ion battery. Obtain the frequency dispersion curve of the battery to determine the guided wave mode and the optimal excitation frequency range (f0-f1) for the detection of the battery's state of charge (SOC).

Step 2: Based on the battery's parameters, establish a three-dimensional lithium-ion battery simulation model within the finite element simulation software. Excite the guided wave signals within the frequency range (f0-f1) as described in Step 1. By comparing the time-domain waveforms at different excitation frequencies, determine the optimal excitation frequency f2 for the circular piezoelectric patches, as well as the optimal positions for excitation and reception, A1($x_1$, $y_1$, $z_1$) and A2($x_2$, $y_2$, $z_2$).

Step 3: Select circular piezoelectric patches with a center frequency of f2. Use a coupling agent to bond the patches to the positions A1($x_1$, $y_1$, $z_1$) and A2($x_2$, $y_2$, $z_2$) as described in Step 2. Connect the leads of the piezoelectric patches to the corresponding channel interfaces of the arbitrary waveform generator and the digital oscilloscope to complete the positioning and electrical interconnection of the circular piezoelectric patches.

Step 4: Connect the charging and discharging equipment to the lithium-ion battery and the computer, respectively. Control the charging and discharging process of the battery through the computer by using the charging and discharging equipment. The specific charging and discharging protocol involves constant current and constant voltage charging, followed by constant current discharging.

Step 5: Utilize the piezoelectric patch located at position A1($x_1$, $y_1$, $z_1$) on the battery to excite an ultrasonic guided wave, allowing it to propagate through the pouch lithium-ion battery and be received by the piezoelectric patch located at position A2($x_2$, $y_2$, $z_2$). Record the transit time $T_{ref}$ of the ultrasonic guided wave signal.

Step 6: Employ the charging and discharging protocol described in Step 4 to perform three cycles of charging and discharging on the battery. During the constant current discharge process of the battery, repeatedly execute Step 5 at fixed time intervals to obtain the transit times $T_{ij}$ (i=1,2,3; j=0~100) of the ultrasonic guided wave signal under different states of charge, where i represents the number of charging and discharging cycles, and j represents the state of charge.

Step 7: For the same state of charge (SOC=m, where m=0~100) during the three charge-discharge cycles, perform a fit to obtain the fitting curve S of the state of charge versus transit time. The formula is as follows:

$$T_m = \frac{T_{1m} + T_{2m} + T_{3m}}{3}$$

Step 8: Charge the battery using the charge-discharge protocol described in Step 4 to a specific state of charge (SOC)=n, and then repeat Step 5 to obtain the transition time T for this SOC.

Step 9: Substitute the transition time T obtained in Step 8 into the fitting curve S to get the corresponding SOC=n1 for this transition time, completing the detection of the state of charge for the pouch lithium-ion battery.

Compared with the existing technology, this invention has the following beneficial effects:

1. This invention uses a set of circular piezoelectric patches to generate ultrasonic guided waves inside the pouch lithium-ion battery to detect the state of charge (SOC). The detection process only requires attaching the circular piezoelectric patches to the surface of the battery to evaluate the SOC of the area to be tested. This method has obvious advantages in terms of implementation convenience, detection cost, and detection efficiency.

2. This invention uses the changes in the characteristics of the guided wave signal in the time domain to represent the SOC of the battery. There is no need to record external parameters such as current and voltage during the charging and discharging process of the battery. By simply processing the received guided wave signal, it is possible to accurately assess the SOC of the battery. In response to the real-time, rapid, and accurate detection of the SOC of pouch lithium-ion batteries, this invention proposes a new approach to solving the technical problem.

MODES FOR CARRYING OUT THE INVENTION

Here is a detailed explanation of the present invention in conjunction with the accompanying drawings and specific implementation methods. The lithium-ion battery used in this embodiment is the pouch lithium-ion battery 3 shown in FIG. 2, with the anode material layer and the cathode material layer having active materials of graphite and lithium cobalt oxide, respectively. The rated capacity of the battery is 1.75 Ah, and the operating voltage is 3.0-4.2V. The detection system used in this embodiment includes a computer, a digital oscilloscope, an arbitrary waveform generator, a charging and discharging device, and a set of circular piezoelectric patches. The specific implementation steps are as follows:

Step 1: In this embodiment, the dimensions of the pouch lithium-ion battery are as follows: length is 100 mm, width is 50 mm, and thickness is 1.9 mm. The thicknesses of the anode material layer, cathode material layer, and the separator are 77 μm, 57 μm, and 15 μm, respectively, with the active materials of the anode and cathode material layers being graphite and lithium cobalt oxide, respectively. Based on the aforementioned material and size parameters, a theoretical calculation model for the wave propagation in the lithium-ion battery is established, resulting in the frequency dispersion curves of the battery at different states of charge (SOC) as shown in FIG. 1(a), FIG. 1(b), FIG. 1(c) and FIG. 1(d). By observing the variation patterns of the wave propagation frequency dispersion curves at different SOCs, the A0 mode of the wave is selected for detecting the SOC of the battery, with the optimal excitation frequency for the A0 mode being between 100 kHz and 300 kHz.

Figure 1A:
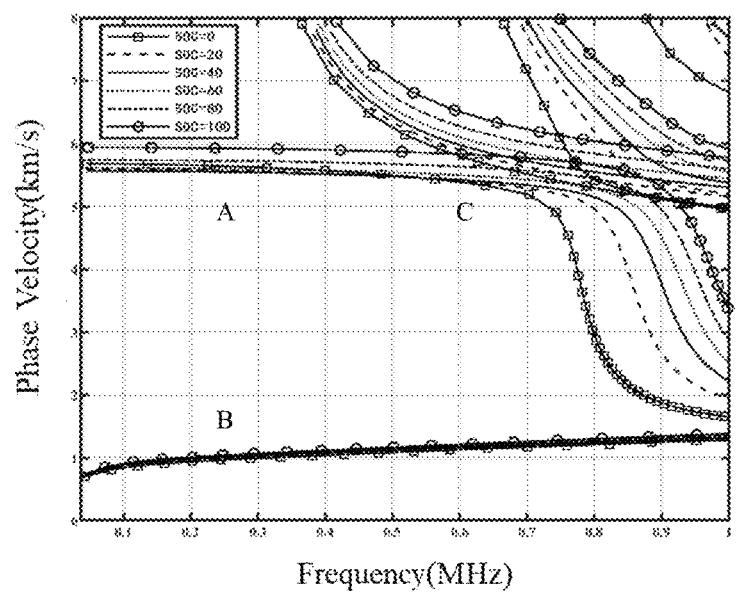
FIG. 1(a), FIG. 1(b), FIG. 1(c) and FIG. 1(d) are the frequency dispersion curves of the pouch lithium-ion battery under different states of charge (SOC) in an embodiment of the present invention.
Figure 1B:
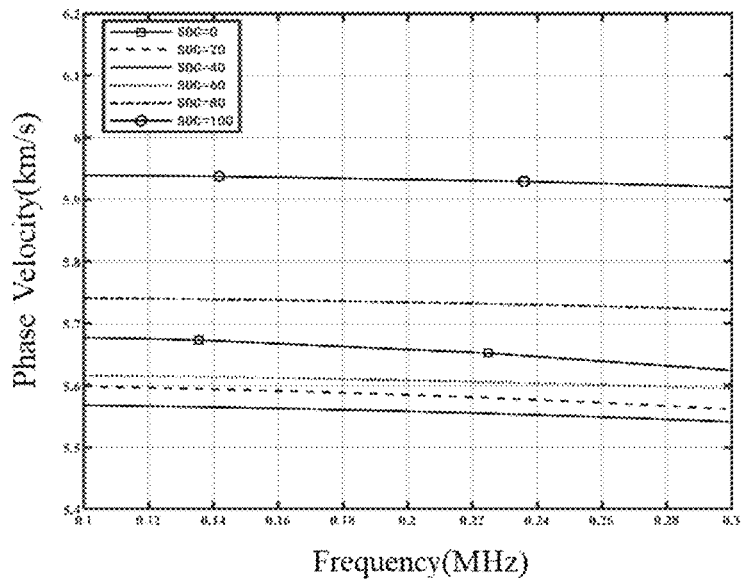
Figure 1C:
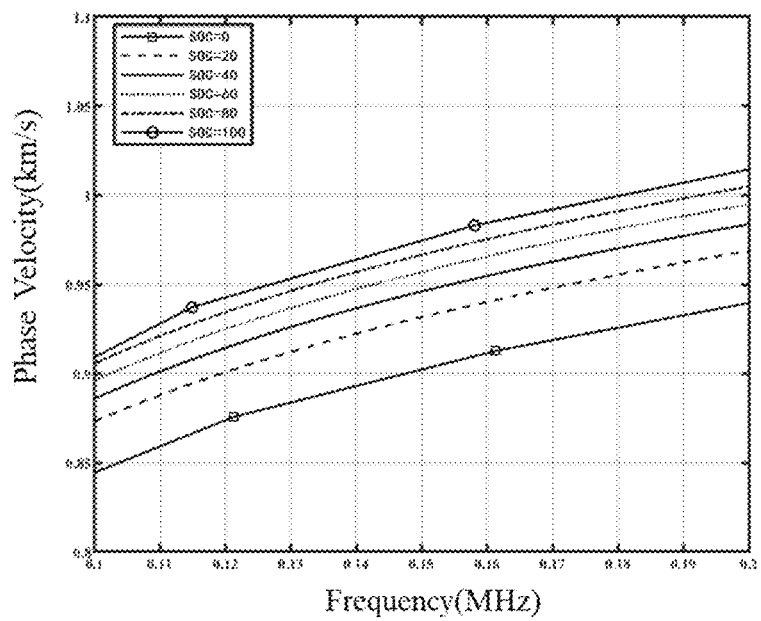
Figure 1D:
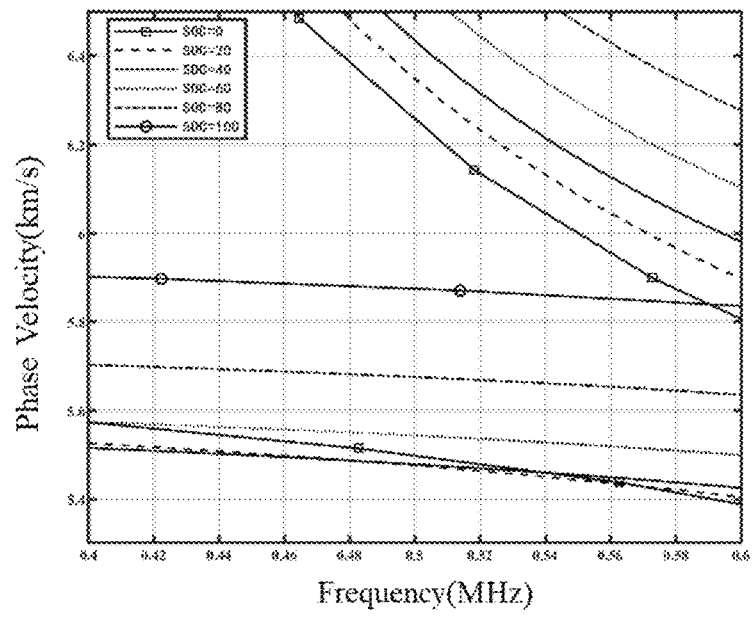
Figure 2:
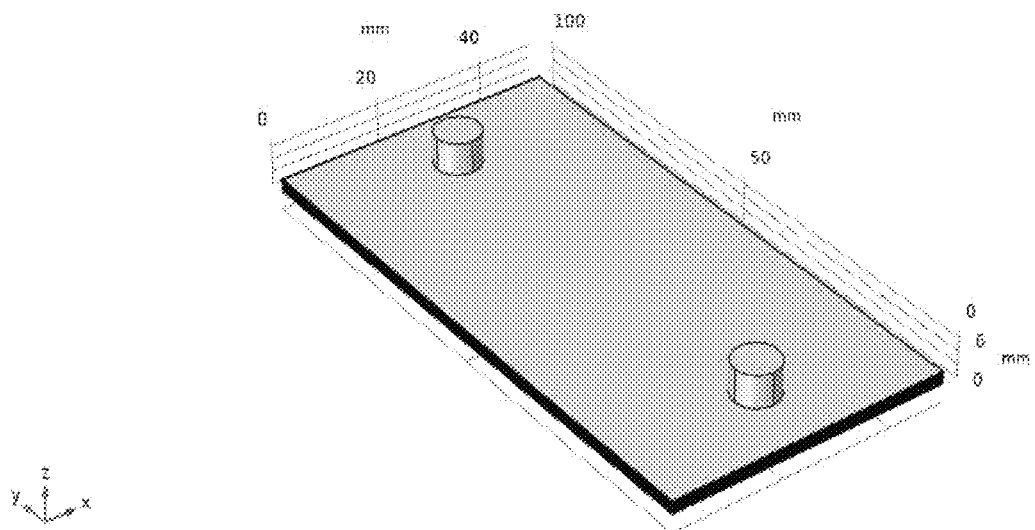
FIG. 2 is the three-dimensional finite element simulation model of the pouch lithium-ion battery in an embodiment of the present invention.

Step 2: A three-dimensional lithium-ion battery simulation model as shown in FIG. 2 is established in finite element simulation software based on the material and size parameters of the battery. Guided wave signals are excited within the frequency range (100 kHz to 300 kHz) described in Step 1. By comparing the received waveforms at different excitation frequencies, the optimal excitation frequency and the positions for exciting and receiving the circular piezoelectric patches are determined. Specifically, the optimal excitation frequency is f2=150 kHz, with the excitation position A1 at coordinates (12.5, 25, 1.9) and the reception position A2 at coordinates (87.5, 25, 1.9).

Figure 3:
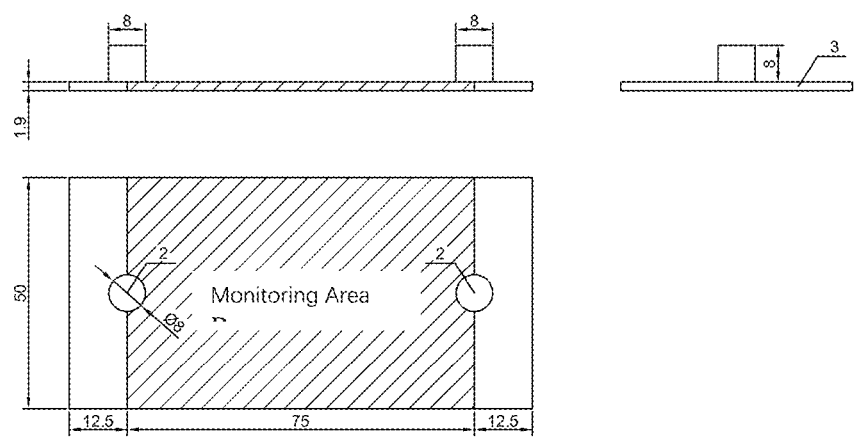
FIG. 3 is the structural dimensions and the detection area of a set of circular piezoelectric patches for the pouch lithium-ion battery in an embodiment of the present invention.

Step 3: A set of circular piezoelectric patches with a center frequency of 150 kHz and a diameter of φ8 mm is selected. The patches are attached to the positions A1 (12.5, 25, 1.9) and A2 (87.5, 25, 1.9) as described in Step 2, using the Olympus SWC-2 couplant. The leads of the piezoelectric patches are connected to the corresponding channel interfaces of the arbitrary waveform generator and the digital oscilloscope, respectively, to complete the positioning and electrical interconnection of the circular piezoelectric patches. The detection area of a set of circular piezoelectric patches is shown in FIG. 3.

Figure 4:
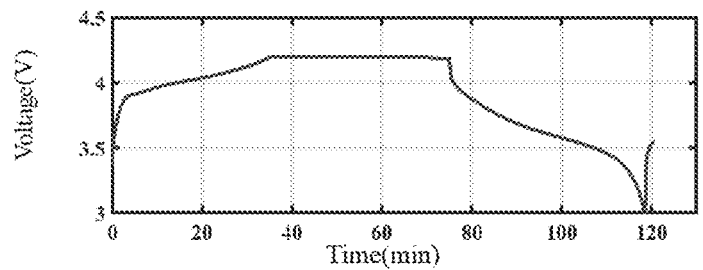
FIG. 4(a) and FIG. 4(b) are the charge-discharge curves of the pouch lithium-ion battery in an embodiment of the present invention.
Figure 4:
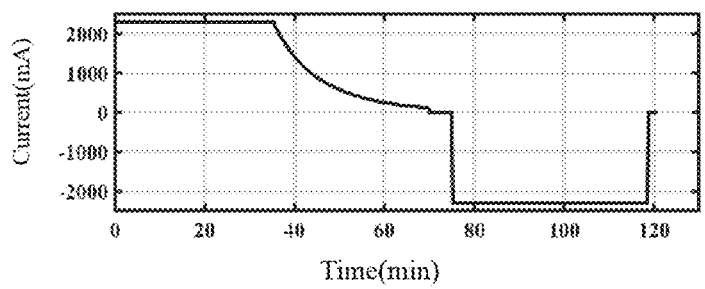
Figure 5:
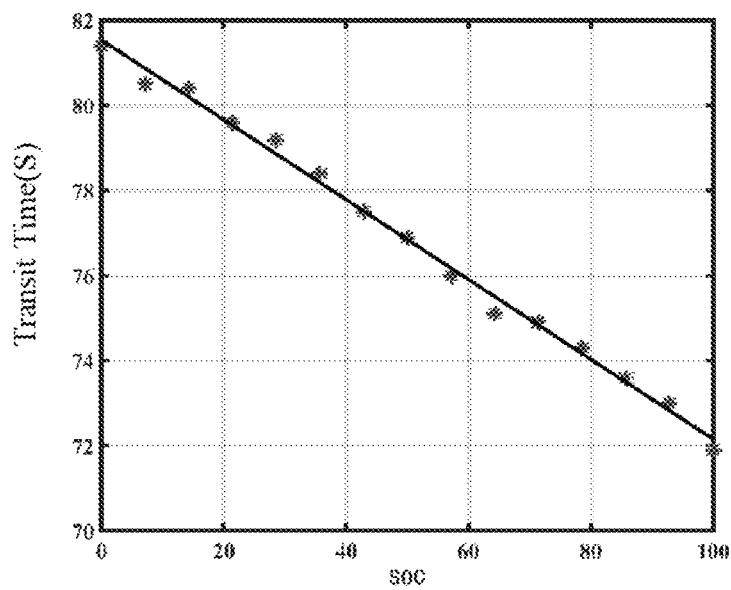
FIG. 5 is the fitting curve S of the state of charge (SOC) versus transition time for the pouch lithium-ion battery in an embodiment of the present invention.

Step 4: The charging and discharging device is connected to the lithium-ion battery and the computer, respectively. The computer controls the charging and discharging device to charge and discharge the battery. The specific charging and discharging protocol is constant current and constant voltage charging, constant current discharging. The charging current during the constant current charging phase is 2.3A, the charging voltage during the constant voltage charging phase is 4.2V, the charging cut-off current is 0.115A, and the discharging current during the constant current discharging phase is 2.3A, with a discharge cut-off voltage of 3.0V. The specific charging and discharging curve is shown in FIG. 4(a) and FIG. 4(b).

Step 5: An arbitrary waveform generator produces a Hann window-modulated five-cycle sine signal (peak-to-peak value of 10V, center frequency of 150 kHz) to excite the circular piezoelectric patch located at position A1 on the battery. This generates ultrasonic guided waves inside the battery, which are received by the piezoelectric patch at position A2. The transit time $T_{ref}$ of the ultrasonic guided wave signal is recorded.

Step 6: Using the charging and discharging protocol described in Step 4, perform three cycles of charging and discharging on the battery. During the constant current discharge process, repeat Step 5 at intervals of 3 minutes to obtain the transit times $T_{ij}$ (i=1,2,3; j=0~100) of the ultrasonic guided wave signal under different states of charge (SOC) of the battery, where: i represents the number of charging and discharging cycles, and j represents the state of charge.

Step 7: For the same state of charge (SOC=m, where m=0~100) during three charging and discharging cycles, perform fitting to obtain the fitting curve of the state of charge versus transit time, which is represented by the equation y=−0.09388x+81.54, where x denotes the state of charge and y denotes the transit time. The R-value for the fitting curve is 0.9946.

Figure 6:
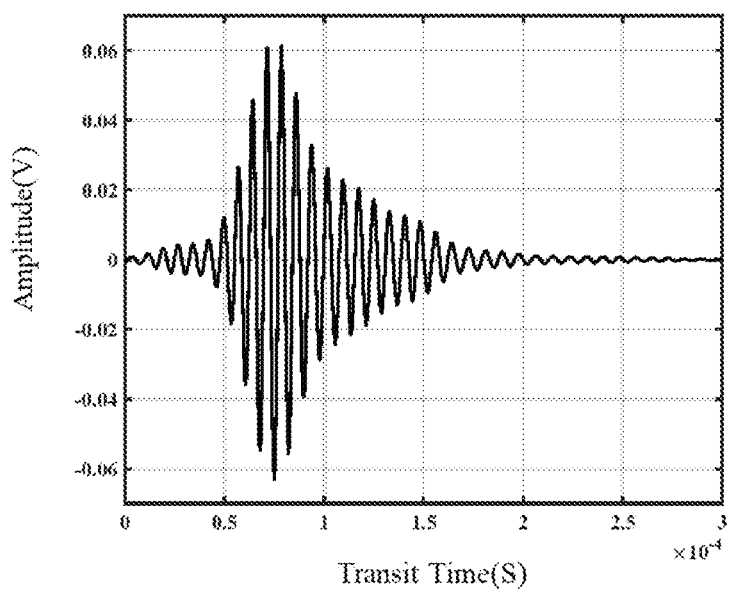
FIG. 6 is the time-domain waveform of the guided wave signal at a specific state of charge (SOC) for the pouch lithium-ion battery in an embodiment of the present invention.
Figure 7:
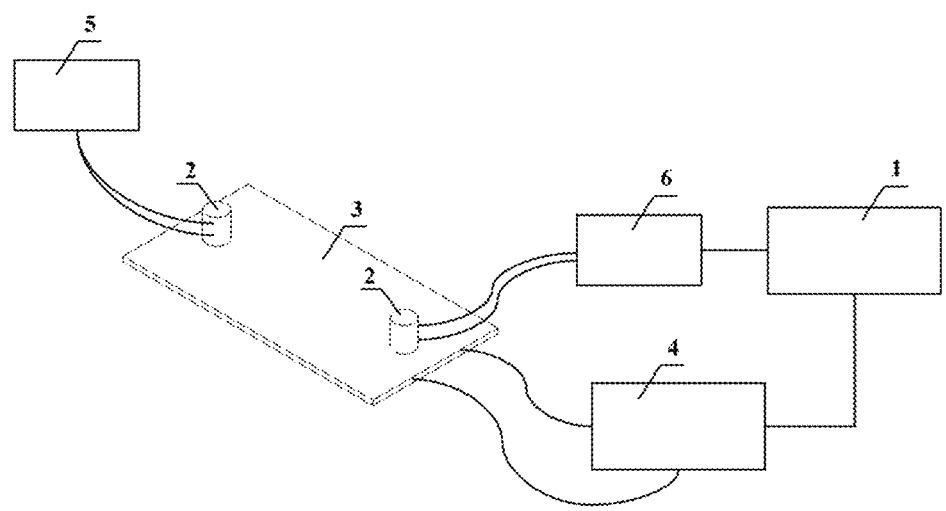
FIG. 7 is a schematic diagram of the detection system connections.

Step 8: Using the charging and discharging protocol described in Step 4, perform a single charge-discharge cycle on the battery. During the constant current discharge phase, discharge the battery for 15 minutes at a current of 2.3A. At this point, the SOC displayed by the charging and discharging equipment is calculated as $$SOC = \frac{\text{Rated Capacity of the Battery} - \text{Discharged Capacity}}{\text{Rated Capacity of the Battery}} \times 100\%,$$

resulting in an SOC of 67.16%. Then, repeat Step 5 to obtain the time-domain waveform of the ultrasonic guided wave signal at this SOC, as shown in FIG. 6. From this, the transit time T of the A0 mode of the guided wave is extracted to be 75.1 μs.

Step 9: Substitute the transit time T=75.1 μs obtained in Step 8 into the fitting curve y=−0.09388x+81.54 to determine the corresponding state of charge (SOC) for this transit time, which is found to be 68.5%. This completes the detection of the state of charge for the pouch lithium-ion battery. The SOC value of 68.5%, derived from the fitting curve, is within a 2% difference from the SOC calculated using the formula $$SOC = \frac{\text{Rated Capacity of the Battery} - \text{Discharged Capacity}}{\text{Rated Capacity of the Battery}} \times 100\%.$$

This confirms that the relationship between the wave propagation characteristic parameter (transit time) and the state of charge (SOC) can accurately complete the detection of the state of charge (SOC) for the pouch lithium-ion battery.

The invention claimed is:

1. A method for in-situ detection of a state of charge (SOC) of a soft-packaged lithium-ion battery using an ultrasonic guided wave, wherein a detection device for implementing the method includes a computer, a set of circular piezoelectric patches, a charging and discharging equipment, an arbitrary waveform generator, and a digital oscilloscope; the computer is connected to the charging and discharging equipment and the digital oscilloscope, the circular piezoelectric patches are connected to the arbitrary waveform generator and the digital oscilloscope;
the set of circular piezoelectric patches includes two circular piezoelectric patches, a center frequency of the circular piezoelectric patches is 150 kHz, the two circular piezoelectric patches are symmetrically attached to a surface of the soft-packaged lithium-ion battery at a distance of 3/4 length of the soft-packaged lithium-ion battery, and a A0 mode of the ultrasonic guided wave is excited for the detection of the state of charge of the soft-packaged lithium-ion battery;
the method comprises the following steps:
obtaining frequency dispersion curves of the soft-packaged lithium-ion battery at different states of charge and determining, based on variation patterns of the frequency dispersion curves, a mode of the ultrasonic guided wave and an optimal excitation frequency range for detecting the state of charge (SOC) of the soft-packaged lithium-ion battery; identifying a most optimal excitation frequency, an excitation position and a reception position based on a finite element simulation result; producing, by the arbitrary waveform generator, a Hanning-window-modulated five-cycle sine signal to excite one of the two circular piezoelectric patches that is located at the excitation position on the surface of the soft-packaged lithium-ion battery; exciting the one of the two circular piezoelectric patches generates an ultrasonic guided wave within the soft-packaged lithium-ion battery, which is then received by another one of the two circular piezoelectric patches that is located at the reception position on the surface of the soft-packaged lithium-ion battery; a signal of the received ultrasonic guided wave is processed to extract time-domain characteristic parameters of the received ultrasonic guided wave, based on a correspondence between the time-domain characteristic parameters and the state of charge, the state of charge of the soft-packaged lithium-ion battery is detected;

using a charging and discharging protocol, the soft-packaged lithium-ion battery is subjected to three charge-discharge cycles, during a constant current discharge process, the circular piezoelectric patch located at the excitation position on the surface of the soft-packaged lithium-ion battery is repeatedly excited at 3-minute intervals to obtain transit time Tij of the received ultrasonic guided wave at predetermined states of charge of the soft-packaged lithium-ion battery, here, i represents the number of charge-discharge cycles, and j represents the state of charge;

the transit time Tij obtained in the three charge-discharge cycles at a same state of charge (j=m) are averaged using the following formula to obtain an average transit time $T_m$:

$$T_m = \frac{T_{1m} + T_{2m} + T_{3m}}{3}$$

where m ranges from 0 to 100, the average transit time $T_m$ is then fitted against the predetermined states of charge to obtain a fitting curve of state of charge versus transit time for the soft-packaged lithium-ion battery;

after the fitting curve is established, using the charging and discharging protocol to perform a single charge-discharge cycle to charge the soft-packaged lithium-ion battery to another predetermined state of charge (SOC=n1), the another predetermined state of charge is calculated using the formula:

$$SOC = \left(\frac{\text{Battery Rated Capacity} - \text{Dischatge Capacity}}{\text{Battery Rated Capacity}}\right) \times 100\%$$

the time-domain waveform of the ultrasonic guided wave signal at the another predetermined state of charge is obtained, from which transit time T of the A0 mode of the ultrasonic guided wave is extracted;

the transit time T is then substituted into the fitting curve to determine a state of charge (SOC=n2) corresponding to the transit time T;

$$SOC = \left(\frac{\text{Battery Rated Capacity} - \text{Discharge Capacity}}{\text{Battery Rated Capacity}}\right) \times 100\%$$

if the difference between the SOC=n2 calculated from the fitting curve and the SOC=n1 calculated using the formula is within 2%, the difference between the SOC=n2 and the SOC=n1 validates that an unknown state of charge of the same soft-packaged lithium-ion battery can be determined using the fitting curve and a transit time corresponding to the unknown state of charge.

* * * * *